United States Patent
Kim

(10) Patent No.: US 7,978,547 B2
(45) Date of Patent: Jul. 12, 2011

(54) DATA I/O CONTROL SIGNAL GENERATING CIRCUIT IN A SEMICONDUCTOR MEMORY APPARATUS

(75) Inventor: Chang-Il Kim, Ichon (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 12/834,837

(22) Filed: Jul. 12, 2010

(65) Prior Publication Data

US 2010/0271890 A1 Oct. 28, 2010

Related U.S. Application Data

(63) Continuation of application No. 11/950,172, filed on Dec. 4, 2007, now Pat. No. 7,755,954.

(30) Foreign Application Priority Data

Dec. 7, 2006 (KR) .................. 10-2006-0123564

(51) Int. Cl.
*G11C 7/00* (2006.01)
(52) U.S. Cl. ............... 365/194; 365/193; 365/233.1; 365/233.12; 365/196; 365/207
(58) Field of Classification Search .............. 365/194, 365/193, 233.11, 233.1, 233.12, 196, 207
See application file for complete search history.

(56) References Cited

U.S. PATENT DOCUMENTS

| | | | |
|---|---|---|---|
| 6,515,938 B2 | 2/2003 | Tsuruto et al. | |
| 6,748,513 B1 | 6/2004 | Rajappa et al. | |
| 6,836,165 B2 | 12/2004 | Goto et al. | |
| 6,907,487 B2 | 6/2005 | Singh et al. | |
| 6,915,407 B2 | 7/2005 | Rajappa et al. | |
| 6,982,923 B2 | 1/2006 | Ootsuki | |
| 7,030,671 B2 | 4/2006 | Park | |
| 7,224,625 B2 | 5/2007 | Dietrich et al. | |
| 7,423,461 B2 | 9/2008 | Nakaya et al. | |
| 2005/0105363 A1* | 5/2005 | Ko ............... | 365/222 |

FOREIGN PATENT DOCUMENTS

| | | |
|---|---|---|
| JP | 02159815 | 6/1990 |
| JP | 11017516 | 1/1999 |
| JP | 2003273712 | 9/2003 |
| JP | 2005348296 | 12/2005 |
| KR | 1020060016656 | 2/2006 |

* cited by examiner

*Primary Examiner* — Thong Q Le
(74) *Attorney, Agent, or Firm* — Baker & McKenzie LLP

(57) ABSTRACT

A circuit for generating a data I/O control signal used in a semiconductor memory apparatus comprises a delay block for generating a delay signal having a relatively short delay value and a delay signal having a relatively long delay values, and a selection block for selecting any one of the delay signals according to an operational mode. The selection block selects an output signal of the first delay unit in a high-speed operation mode and selects an output signal of the second delay unit in a low-speed operation mode.

8 Claims, 5 Drawing Sheets

US 7,978,547 B2

DATA I/O CONTROL SIGNAL GENERATING CIRCUIT IN A SEMICONDUCTOR MEMORY APPARATUS

CROSS-REFERENCES TO RELATED APPLICATION

This application is a continuation of application Ser. No. 11/950,172, filed Dec. 4, 2007, titled "Data I/O Control Signal Generating Circuit in a Semiconductor Memory Apparatus," which is incorporated herein by reference in its entirety as if set forth in full, and which claims priority under 35 U.S.C. 119(a) to Korean application number 10-2006-0123564, filed on 7 Dec., 2006, in the Korean Patent Office, which is incorporated by reference in its entirety as if set forth in full.

BACKGROUND

1. Technical Field

The embodiments described herein are related to a semiconductor memory apparatus and, more particularly, to a circuit for generating a data input/output control signal used in a semiconductor memory apparatus.

2. Related Art

A conventional semiconductor memory apparatus includes a memory cell array having a plurality of memory cells and a peripheral circuit for storing and reading out memory cell data. The memory cell array includes a plurality of word lines and a plurality of bit lines that intersect the word lines. Each of the plurality of memory cells is positioned at an intersection of the word and bit lines. Each of the memory cells in a conventional apparatus can include a MOS transistor and a capacitor connected to the MOS transistor.

The peripheral circuit includes a row decoder for driving the word lines and a column decoder for driving the bit lines. The row decoder receives a row address and selects a specific word line, and the column decoder generates a column selection signal and selects a specific bit line, thereby selecting the specific memory cell connected the selected word and bit line. The MOS transistor of the selected memory cell is driven to store information in the capacitor, which is connected to the MOS transistor, or to read out the stored information.

Conventional semiconductor memory apparatus are driven in a high-speed operation mode. That is, since conventional semiconductor memory apparatus require high speed operations, they all operate in what is termed a high-speed operation mode regardless of the length of a column address strobe (CAS) latency.

As conventional semiconductor memory apparatus become highly integrated, the load on each bit line pair (BL and /BL) and/or on a local input/output line pair (LI0 and /LI0) is increasing. Thus, the operating margin for a conventional semiconductor memory apparatus is decreasing, and in fact hardly exists in many cases.

Conventional semiconductor memory apparatus can also operate in a low-speed operation mode; however, since almost all conventional semiconductor memory apparatus, as mentioned above, are set up for high-speed operation mode, the low-speed operation mode is also carried out under the control of the tightly restricted input/output (I/O) operation of the high-speed operation mode. As a result, a data I/O error can occur in the low-speed operation mode of a conventional semiconductor memory apparatus.

SUMMARY

A circuit for generating a data I/O control signal used in a semiconductor memory apparatus having a sufficient operating margin regardless of the operating mode is described herein.

According one aspect, there is provided a circuit for generating a data I/O control signal used in a semiconductor memory apparatus, the circuit comprising a delay block for generating a delay signal having a relatively short delay value and a delay signal having a relatively long delay value, and a selection block for selecting one of the delay signals according to an operation mode. The delay block can include a first delay unit for generating the delay signal having a relatively short delay value, and a second delay unit for generating the delay signal having a relatively long delay value.

The selection block can be configured to select an output signal of the first delay unit in a high-speed operation mode and select an output signal of the second delay unit in a low-speed operation mode. The delay block can be configured to receive a clock pulse and then generate a clock pulse delayed for a relatively short time and a clock pulse delayed for a relatively long time. The selection block can further include a signal combination unit for generating a column selection signal by logically combining the clock pulse with either the clock pulse delayed for the relatively short time or the clock pulse delayed for the relatively long time.

The delay block can be configured to receive a column selection signal for generating a column selection signal delayed for a relatively short time and a column selection signal delayed for a relatively long time. The selection block can be configured to then output either the column selection signal delayed for a relatively short time or the column selection signal delayed for a relatively long time as an input/output strobe signal.

A high-speed operation mode signal is then enabled when a CAS latency signal is more than a predetermined value, and a low-speed operation mode signal is enabled when the CAS latency signal is less than the predetermined value.

According another aspect, there is provided a circuit for generating a data I/O control signal used in a semiconductor memory apparatus, the circuit comprising a delay block including a first delay unit for delaying a clock pulse as much as a first delay value and a second delay unit for delaying the clock pulse as much as a second delay value, wherein the second delay value is larger than the first delay value, a signal selecting unit for selecting a signal of the first delay unit in the high-speed operation mode and selecting a signal of the second delay unit in the low-speed operation mode, and a signal combination unit for generating a column selection signal by logically combining the output signal of the signal selecting unit with the clock pulse.

According still another aspect, there is provided a circuit for generating a data I/O control signal used in a semiconductor memory apparatus, the circuit comprising a first delay block including a first delay unit for delaying a clock pulse as much as a first delay value and a second delay unit for delaying the clock pulse as much as a second delay value, wherein the second delay value is larger than the first delay value, a selection block for selecting a signal of the first delay unit in the high-speed operation mode and selecting a signal of the second delay unit in the low-speed operation mode, a second delay block including a third delay unit for delaying a clock pulse as much as a third delay value and a fourth delay unit for delaying the clock pulse as much as a fourth delay value, wherein the fourth delay value is larger than the third delay value, and a transfer block for outputting a signal of the third delay unit as an input/output strobe signal in the high-speed operation mode and outputting a signal of the fourth delay unit as the input/output strobe signal in the low-speed operation mode.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
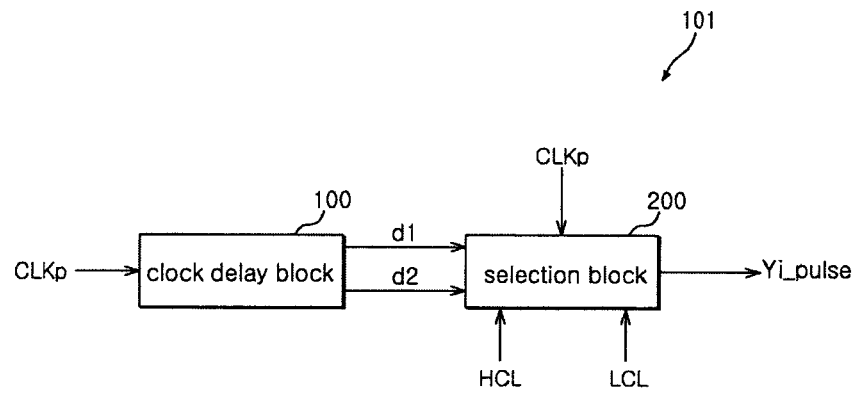
FIG. 1 is a block diagram illustrating an example portion of a data I/O control signal generator according to one embodiment of the present invention.

FIG. 1 is a diagram illustrating a portion 101 of an example data I/O control signal generator configured in accordance with one embodiment. Referring to FIG. 1, it can be seen that the portion of the data I/O control signal generator 101 includes a clock delay block 100 and a selection block 200. The clock delay block 100 can be configured to receive a clock pulse (CLKp) and to generate a plurality of delay signals with different delay values, for example, two delay signals (d1) and (d2). The selection block 200 can be configured to select any one of the two delay signals (d1) and (d2) according to a high operation mode or a low operation mode and combine the selected delay signal and the clock pulse (CLKp), thereby generating an input/output control signal, for example, a column selection signal (Yi_pulse).

The selection block 200 is also configured to receive a High CAS Latency (HCL) signal and a low CAS Latency (LCL) signal as inputs. The HCL signal (HCL) indicates high speed operation mode. For example, if a CAS latency is more than a predetermined value, the HCL signal will be active. The LCL signal (LCL) indicates low speed operation mode, e.g., if the CAS latency is less than the predetermined value, the LCL signal (LCL) will be active. Thus, the HCL signal (HCL) and the LCL signal (LCL) are out of phase with each other.

Figure 2:
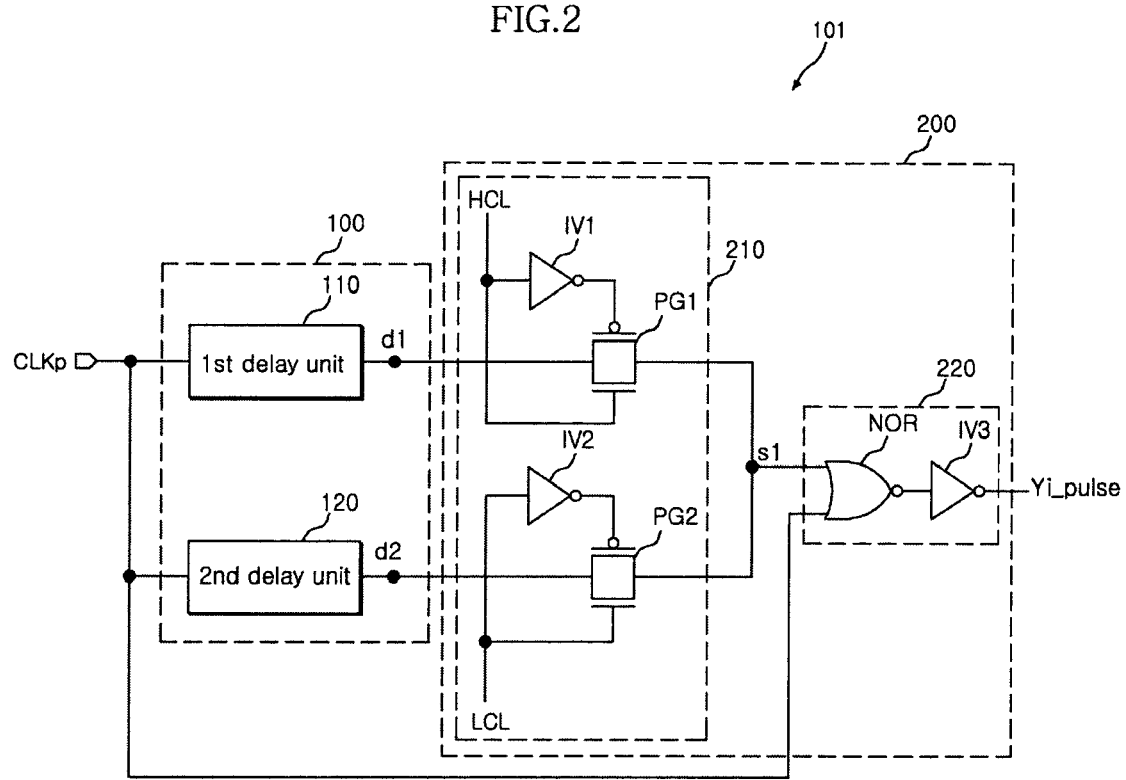
FIG. 2 is a detailed circuit diagram of the portion of the data I/O control signal generator illustrated in FIG. 1.

FIG. 2 is a diagram illustrating the clock delay block 100 and the selection block 200 in more detail. Referring to FIG. 2, it can be seen that the clock delay block 100 can include a first delay unit 110 and a second delay unit 120 each of which has a different delay value. For example, the second delay unit 120 can have a delay value longer than the first delay unit 110. In one embodiment, the first delay unit 110 has a delay time of about 300 ps and the second delay unit 120 has a delay time of about 500 ps. Accordingly, in such an embodiment after the input of the clock pulse (CLKP), the first delay signal (d1) is produced with the delay time of about 300 ps, and the second delay signal (d2) is produced with the delay time of about 500 ps.

Referring again to FIG. 2, the selection block 200 can include a signal selecting unit 210 and a signal combination unit 220. The signal selecting unit 210 can selectively output either signal (d1) or (d2) to the signal combination unit in response to the HCL signal (HCL) or the LCL signal (LCL). For example, the signal selecting unit 210 can be configured to transmit the first delay signal (d1) when the HCL signal is (HCL) enabled to transmit the second delay signal (d2) when the LCL signal (LCL) is enabled.

As illustrated in FIG. 2, the signal selecting unit 210 can include a first pass gate PG1 and a second pass gate PG2. Each of the pass gates can include an NMOS transistor and a PMOS transistor. The HCL signal (HCL) can be input to a gate of the NMOS transistor of the first pass gate PG1 and the HCL signal (HCL), which is inverted by an inverter IV1, can be input to a gate of the PMOS transistor. When the HCL signal (HCL) is enabled in a high level, the first pass gate PG1 transfers the first delay signal (d1) of the first delay unit 110 as an output signal (s1) of the signal selecting unit 210.

Similarly, the LCL signal (LCL) can be input to a gate of the NMOS transistor of the second pass gate PG2 and the LCL signal (LCL), which is inverted by an inverter IV2, can be input to a gate of the PMOS transistor. When the LCL signal (LCL) is enabled in a high level, the second pass gate PG2 transfers the second delay signal (d2) of the second delay unit 120 as the output signal (s1) of the signal selecting unit 210. Thus, in this manner, the first delay signal (d1) and the second delay signal (d2) can be selectively transferred to the output signal (s1) of the signal selecting unit 210.

The signal combination unit 220 can be configured to logically combine the output signal (s1) of the signal selecting unit 210 and the clock pulse (CLKp) to generate the column selection signal (Yi_pulse). As illustrated, the signal combination unit 220 can include an OR gate. In one embodiment, the signal combination unit 220 can include a NOR gate NOR, which receives the output signal (s1) of the signal selecting unit 210 and the clock pulse (CLKp), and an inverter IV3, which inverts an output signal of the NOR gate NOR.

The selection block 200 can be configured to operate as follows: first, when the HCL signal (HCL) is enabled in a high level, the first pass gate PG1 is turned on so that the first delay signal (d1) of the first delay unit 110 is transferred as the output signal (s1) of the signal selecting unit 210. At this time, the second pass gate PG2 does not operate because the LCL signal (LCL), which is out of phase with the HCL signal (HCL), is maintained in a low level.

Meanwhile, when the LCL signal (LCL) is enabled in a high level, the second pass gate PG2 is turned on so that the second delay signal (d2) of the second delay unit 120 is transferred as the output signal (s1) of the signal selecting unit 210.

The signal combination unit 220 performs an OR operation on the output signal (s1) of the signal selecting unit 210 and the clock pulse (CLKp) to generate the column selection signal (Yi_pulse). For example, in cases where the first delay unit 110 has a delay time of 300 ps and the second delay unit 120 has a delay time of 500 ps, a pulse width of the column selection signal (Yi_pulse) becomes 300 ps wider than the clock pulse (CLKp) when the HCL signal (HCL) is enabled in a high level. Meanwhile, when the LCL signal (LCL) is enabled in a high level, the pulse width of the column selection signal (Yi_pulse) becomes 500 ps wider than the clock pulse (CLKp).

Accordingly, the column selection signal (Yi_pulse) has a pulse width that is relatively wider in the low speed mode, when the LCL signal (LCL) is in a high level, than in the high speed mode, when the HCL signal (HCL) is in a high level. Thus, an increased operating margin can be secured.

Figure 3:
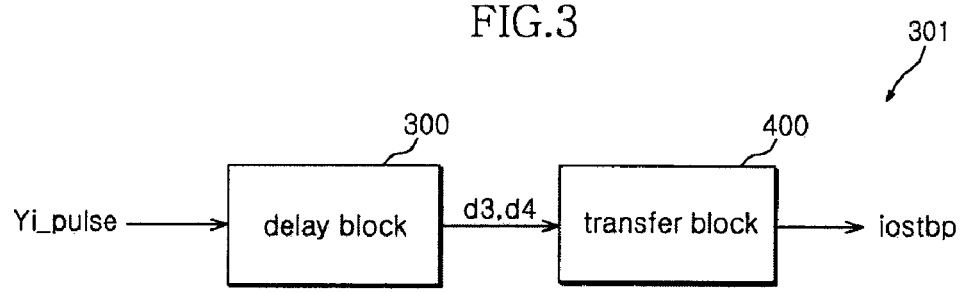
FIG. 3 is a block diagram illustrating an I/O control signal generator according to one embodiment.

FIG. 3 is a block diagram illustrating an example I/O strobe signal generator 301 according to one embodiment. Referring to FIG. 3, it can be seen that the I/O strobe signal generator 301 can include a delay block 300 and a transfer block 400. The delay block 300 can be configured to receive the column selection signal (Yi_pulse) and generate two different delay signals (d3) and (d4).

Figure 4:
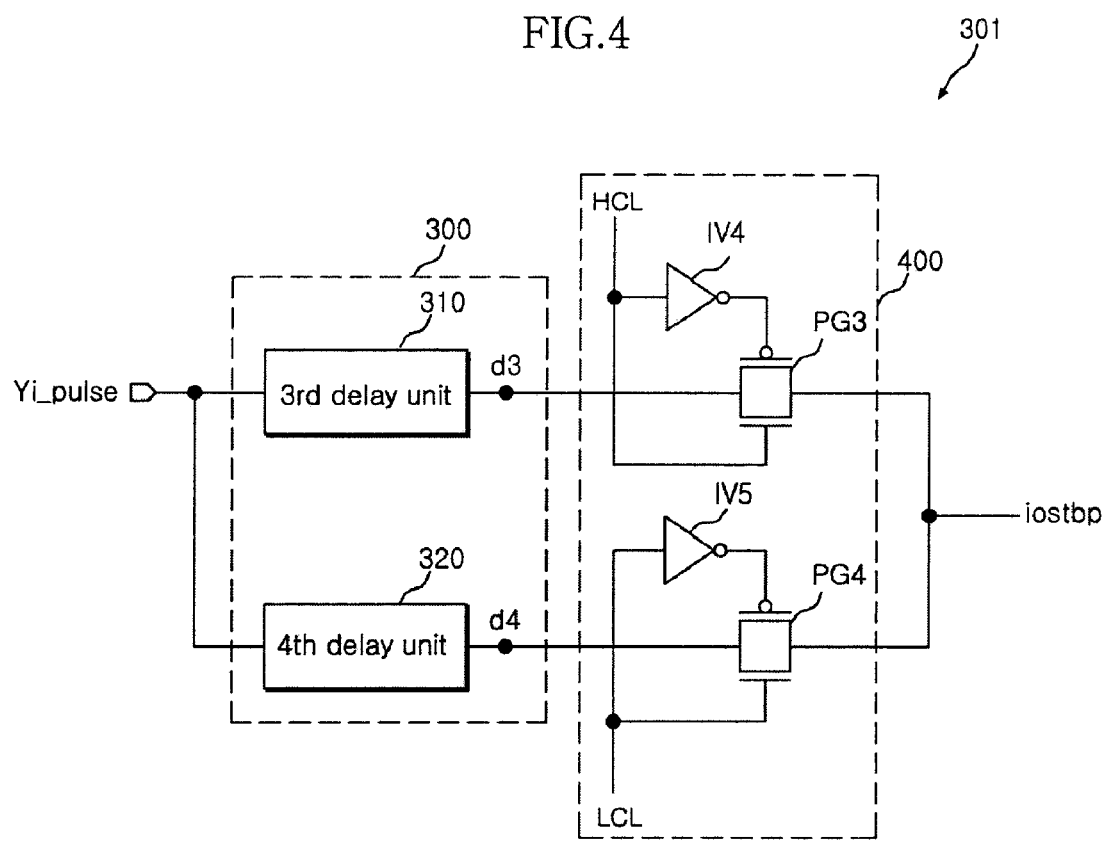
FIG. 4 is a detailed circuit diagram of the data I/O control signal generator in FIG. 3.

As illustrated in FIG. 4, the delay block 300 can include a third delay unit 310 and a fourth delay unit 320. The third delay unit 310 and the fourth delay unit 320 can have different delay times. For example, the fourth delay unit 320 can have a delay time longer than the third delay unit 310. In one embodiment, for example, the third delay unit 310 can have a delay time of about 700 ps and the fourth delay unit 320 can have a delay time of about 900 ps. Accordingly, the third delay unit 310 can be configured to output a signal that is delayed for 700 ps more than the column selection signal (Yi_pulse), and the fourth delay unit 320 outputs a signal that is delayed for 900 ps more than the column selection signal (Yi_pulse).

Referring again to FIG. 4, the transfer block 400 can be configured to output the signal provided from the delay block 300 as an I/O strobe signal (iostbp) depending on whether the HCL signal (HCL) or the LCL signal (LCL) is enabled. As illustrated in FIG. 4, the transfer block 400 can include a third pass gate PG3 and a fourth pass gate PG4. The HCL signal (HCL) can be input to a gate of a NMOS transistor of the third pass gate PG3 and the HCL signal (HCL), which is inverted by an inverter IV4, can be input to a gate of a PMOS transistor of the third pass gate PG3. When the HCL signal (HCL) is enabled in a high level, the third pass gate PG3 is connected to the delay block 300 so that the third delay signal (d3) of the third delay unit 310 can be outputted as the I/O strobe signal (iostbp). The LCL signal (LCL) can be input to a gate of a NMOS transistor of the fourth pass gate PG4 and the LCL signal (LCL), which is inverted by an inverter IV5, can be input to a gate of a PMOS transistor of the fourth pass gate PG4. When the LCL signal (LCL) is enabled in a high level, the fourth pass gate PG4 is connected to the delay block 300 so that the fourth delay signal (d4) of the fourth delay unit 320 can be outputted as the I/O strobe signal (iostbp).

The I/O strobe signal generator can be configured to operate as follows: the column selection signal (Yi_pulse) is input to the delay block 300 to generate the third delay signal (d3) which is delayed for a relatively short time, and the fourth delay signal (d4) which is delayed for a relatively long time. Thereafter, in the high speed mode, that is when the HCL signal (HCL) is enabled in a high level, the third delay signal (d3), which is delayed for a relatively short time, is outputted as the I/O strobe signal (iostbp) by an operation of the third pass gate PG3 of the transfer block 400. In the low speed mode, that is when the LCL signal (LCL) is enabled in a high level, the fourth delay signal (d4), which is delayed for a relatively long time, is outputted as the I/O strobe signal (iostbp) by an operation of the fourth pass gate PG4 of the transfer block 400.

Accordingly, in the low speed mode, an I/O strobe signal (iostbp), which is enabled after a longer delay time, can be generated.

Figure 5:
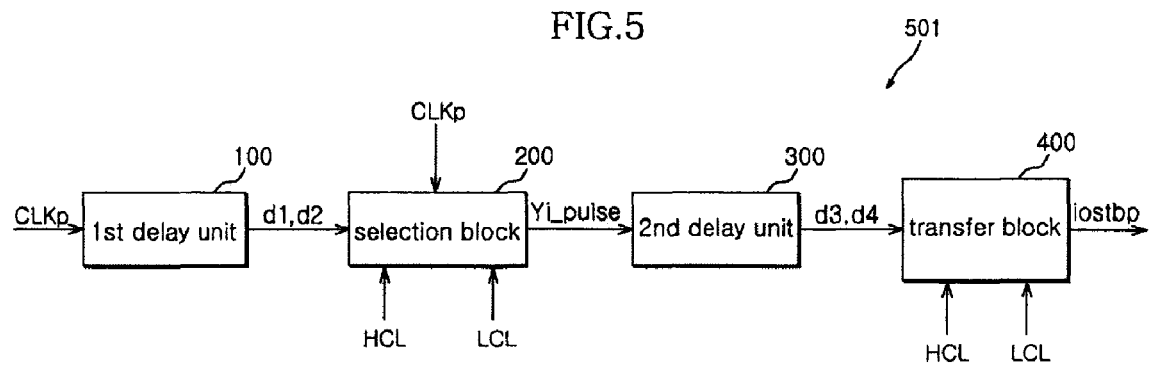
FIG. 5 is a block diagram illustrating a data I/O control signal generator that can include the portion illustrated in FIG. 1 and the I/O control signal generator illustrated in FIG. 3.
Figure 6:
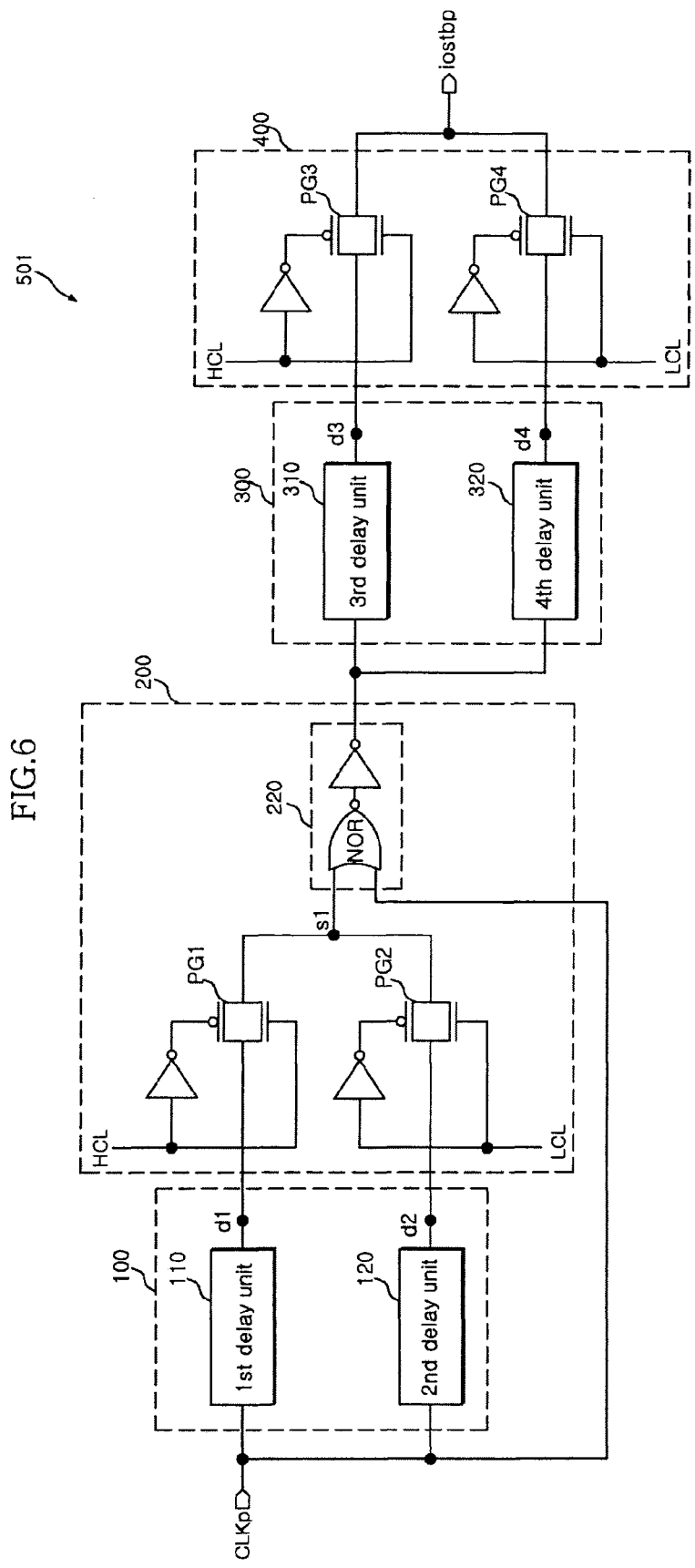
FIG. 6 is a detailed circuit diagram illustrating the data I/O control signal generator illustrated in FIG. 5.

FIGS. 5 and 6 are diagrams illustrating an example data I/O control signal generator 501, which can include the portion 101 and the I/O strobe signal generator 301. As illustrated in FIGS. 5 and 6, the column selection signal (Yi_pulse), which can be a signal with a different delay value according to the operational mode, can be generated by the delay block 100, which includes the first delay unit 110 and the second delay unit 120, and the selection block 200, which includes the signal selecting unit 210 and the signal combination unit 220. An I/O strobe signal (iostbp) can then be generated by further selectively delaying the column width selection signal (Yi_pulse) in second delay unit 300 and transfer block 400.

The data I/O control signal generator 501 can operate as follows: first, in the high speed mode, the column selection signal (Yi_pulse) having a relatively short delay value can be generated by a logical combination of the first delay signal (d1), which is the output signal of the first delay unit 110 having a relatively short delay value, and the clock pulse (CLKp). Then, the column selection signal (Yi_pulse) having a relatively short delay value can be delayed again by the third delay unit 310, which has a relatively short delay value and is outputted as the I/O strobe signal (iostbp).

Meanwhile, in the low speed mode, the column selection signal (Yi_pulse) having a relatively long delay value can be generated by a logical combination of the second delay signal (d2), which is the output signal of the second delay unit 120 having a relatively long delay value, and the clock pulse (CLKp). Then, the column selection signal (Yi_pulse) having a relatively long delay value can be delayed again by the fourth delay unit 320, which has a relatively long delay value and is outputted as the I/O strobe signal (iostbp).

Accordingly, in the low speed mode where the LCL signal (LCL) is enabled in a high level, a pulse width of the column selection signal can be made wider, and the I/O strobe signal (iostbp) can be generated after a relatively long time due to the relatively wider pulse width of the column selection signal (Yi_pulse).

Since the pulse width of the column selection signal (Yi_pulse) becomes wider, the amount of charge flowing from a sense amplifier to a local I/O line pair (LI0 and /LI0) becomes sufficiently large. Also, since the I/O strobe signal (iostbp) can be enabled after a voltage difference between the local I/O line pair (LI and /LI0) becomes sufficiently large, data can be derived more stably.

While first delay unit 100, selection block 200, second delay unit 300, and transfer block 400 are described as being the same as illustrated in FIGS. 1-4, it will be understood that this does not necessarily need to be the case. Thus, any circuit configuration that produces the results described herein can be used in conjunction with the apparatus and methods described herein.

Figure 7:
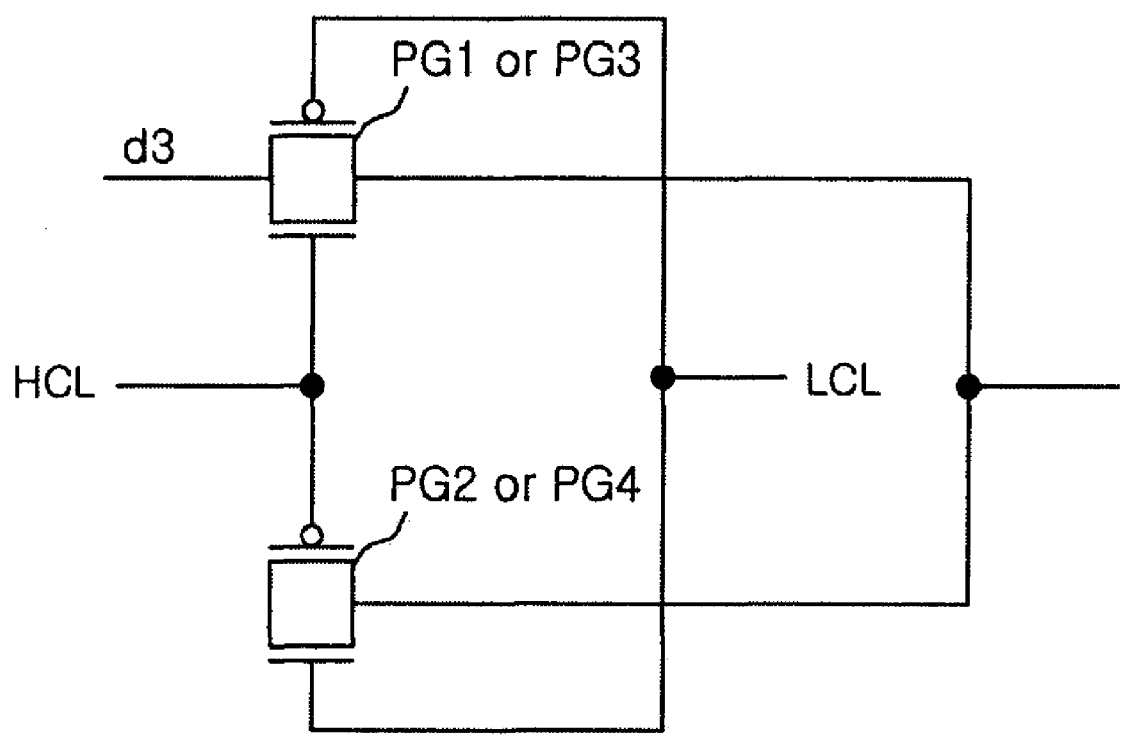
FIG. 7 is a circuit diagram illustrating an alternative implementation of the portion of the data I/O control signal generator illustrated in FIG. 1 and for the I/O control signal generator illustrated in FIG. 3.

For example, in the embodiments described above, the signal selecting unit 210 and the transfer block 400 can include the first pass gate PG1 or the third pass gate PG3, which are turned on in response to the HCL signal (HCL) and the inverted HCL signal (HCL) and the second pass gate PG2 or the fourth pass gate PG4 which are turned on in response to the LCL signal (LCL) and the inverted LCL signal (LCL); however, as illustrated in FIG. 7, the HCL signal (HCL) can be input to the NMOS transistor of the first pass gate PG1 or the third pass gate PG3 and the LCL signal (LCL) can be inputted to the PMOS transistor of the first pass gate PG1 or the third pass gate PG3. Also, the LCL signal (LCL) can be input to the NMOS transistor of the second pass gate PG2 or the fourth pass gate PG4 and the HCL signal (HCL) can be input to the PMOS transistor of the second pass gate PG2 or the fourth pass gate PG4.

Thus, a data I/O control signal generator configured according to the embodiments described herein can stably transfer data in the low speed mode by making the pulse width of the control signal in the high speed mode different from that in the low speed mode. Also, such a generator can transfer data more stably by making the delay value of the I/O strobe signal in the high speed mode different from that in the low speed mode.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A circuit for generating a data I/O control signal used in a semiconductor memory apparatus, comprising:
   a first delay block configured to receive an input pulse, to delay the input pulse by a first delay value, and to output a first delay signal;
   a second delay block configured to receive the input pulse, to delay the input pulse by a second delay value being larger than the first delay value, and to output a second delay signal; and
   a selection block configured to receive the first delay signal and the second delay signal and to select one of the first delay signal and the second delay signal according to a value of a CAS latency signal.

2. The circuit of claim 1, wherein the selection block is configured to select the first delay signal when the selection block receives the CAS latency signal which is more than a predetermined value, and to select the second delay signal when the selection block receives the CAS latency signal which is less than the predetermined value.

3. The circuit of claim 1, wherein the selection block includes:
   a first pass gate for transferring the first delay signal according to the CAS latency signal which is more than a predetermined value; and
   a second pass gate for transferring the second delay signal according to the CAS latency which is less than the predetermined value.

4. The circuit of claim 3, wherein the selection block further includes a signal combination unit for generating a column selection signal by logically combining the input pulse with any one of the first and second delay signals.

5. A circuit for generating a data I/O control signal used in a semiconductor memory apparatus, comprising:
   a first delay block configured to receive an input pulse, to delay the input pulse by a first delay value, and to output a first delay signal;
   a second delay block configured to receive the input pulse, to delay the input pulse by a second delay value, and to output a second delay signal; and
   a selection block configured to receive the first delay signal and the second delay signal and to select one of the first delay signal and the second delay signal according to a CAS latency signal and output a selected signal as a column selecting signal,
   wherein the column selecting signal is a signal which is inputted to a sense amplifier.

6. The circuit of claim 5, wherein the selection block is configured to select the first delay signal when the selection block receives the CAS latency signal which is more than a predetermined value, and to select the second delay signal when the selection block receives the CAS latency signal which is less than the predetermined value.

7. The circuit of claim 5, wherein the selection block includes:
   a first pass gate for transferring the first delay signal according to the CAS latency signal which is more than a predetermined value; and
   a second pass gate for transferring the second delay signal according to the CAS latency which is less than the predetermined value.

8. The circuit of claim 5, wherein the selection block further includes a signal combination unit for generating the column selection signal by logically combining the input pulse with any one of the first and second delay signals.

* * * * *